United States Patent
Takemura

(10) Patent No.: US 8,921,849 B2
(45) Date of Patent: Dec. 30, 2014

(54) INSULATED-GATE FIELD-EFFECT TRANSISTOR

(75) Inventor: Yasuhiko Takemura, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 144 days.

(21) Appl. No.: 13/608,187

(22) Filed: Sep. 10, 2012

(65) Prior Publication Data

US 2013/0069056 A1    Mar. 21, 2013

(30) Foreign Application Priority Data

Sep. 15, 2011   (JP) ................ 2011-201446

(51) Int. Cl.
H01L 29/12      (2006.01)
H01L 29/423     (2006.01)
H01L 29/66      (2006.01)
H01L 29/78      (2006.01)
H01L 29/24      (2006.01)

(52) U.S. Cl.
CPC ...... H01L 29/4236 (2013.01); H01L 29/66666 (2013.01); H01L 29/7828 (2013.01); *H01L 29/42376* (2013.01); *H01L 29/24* (2013.01)
USPC .................... 257/43; 257/E29.068

(58) Field of Classification Search
USPC ............................. 257/43, E29.068
See application file for complete search history.

(56) References Cited

U.S. PATENT DOCUMENTS

| 5,731,856 | A  | 3/1998 | Kim et al.      |
| 5,744,864 | A  | 4/1998 | Cillessen et al.|
| 6,294,274 | B1 | 9/2001 | Kawazoe et al.  |
| 6,563,174 | B2 | 5/2003 | Kawasaki et al. |
| 6,727,522 | B1 | 4/2004 | Kawasaki et al. |

(Continued)

FOREIGN PATENT DOCUMENTS

| EP | 1737044 A | 12/2006 |
| EP | 2226847 A | 9/2010  |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Matthew W Such
*Assistant Examiner* — Monica D Harrison
(74) *Attorney, Agent, or Firm* — Eric J. Robinson; Robinson Intellectual Property Law Office, P.C.

(57) ABSTRACT

A power MISFET using an oxide semiconductor is provided. A drain electrode and a gate electrode having a trapezoidal cross section are formed with a semiconductor layer provided therebetween, a semiconductor layer is formed on a side surface of the gate electrode, and a source electrode is in contact with the semiconductor layer at a portion which overlaps with the top of the gate electrode. Between the drain electrode and the source electrode of such a power MISFET, a power source of 500 V or more and a load are connected in series, and a control signal is input to the gate electrode. Other structures and operating methods are also disclosed.

20 Claims, 7 Drawing Sheets

(56) References Cited

U.S. PATENT DOCUMENTS

| | | |
|---|---|---|
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,765,522 B2 * | 7/2014 | Yamazaki ............ 438/104 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199879 A1 | 9/2005 | Hoffman et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0068852 A1 | 3/2011 | Yamazaki et al. |
| 2011/0127522 A1 | 6/2011 | Yamazaki |
| 2011/0127525 A1 | 6/2011 | Yamazaki et al. |
| 2011/0136301 A1 | 6/2011 | Yamazaki et al. |
| 2011/0181349 A1 | 7/2011 | Yamazaki et al. |
| 2011/0204362 A1 | 8/2011 | Akimoto et al. |
| 2011/0233555 A1 | 9/2011 | Endo |
| 2011/0284837 A1 | 11/2011 | Nishijima |
| 2012/0068183 A1 | 3/2012 | Takemura |
| 2013/0015436 A1 | 1/2013 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

(56) References Cited

OTHER PUBLICATIONS

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39,pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.
Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by PEALD Grown ZnO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

(56) References Cited

OTHER PUBLICATIONS

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, andYb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4203-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

INSULATED-GATE FIELD-EFFECT TRANSISTOR

BACKGROUND OF THE INVENTION

1. Field of the Invention

The present invention relates to a field-effect transistor (FET) using a semiconductor, particularly to a high-withstand-voltage insulated-gate field-effect transistor (hereinafter referred to as power MISFET).

2. Description of the Related Art

An FET is a device in which regions called a source and a drain are provided in a semiconductor, each of the regions is connected to an electrode (a source electrode or a drain electrode), and a voltage is applied to the semiconductor via a gate electrode through an insulating film or a Schottky barrier so that the state of the semiconductor is controlled, whereby current flowing between the source electrode and the drain electrode is controlled. As the semiconductor, a Group 14 element such as silicon or germanium, a compound such as gallium arsenide, indium phosphide, gallium nitride, zinc sulfide, or cadmium telluride, or the like can be used.

In recent years, FETs in which an oxide such as zinc oxide or an indium-gallium-zinc-based oxide (also referred to as In—Ga—Zn-based oxide, IGZO) is used as a semiconductor have been reported (Patent Document 1 and Patent Document 2). FETs using such an oxide semiconductor have comparatively high mobility, and also these oxide semiconductor materials have a large band gap of 3 eV or more.

REFERENCE

Patent Document

[Patent Document 1] United States Patent Application Publication No. 2005/0199879

[Patent Document 2] United States Patent Application Publication No. 2007/0194379

[Patent Document 3] United States Patent Application Publication No. 2011/0127525

SUMMARY OF THE INVENTION

An object of one embodiment of the present invention is to provide a power MISFET using such an oxide semiconductor. Power MISFETs using a silicon semiconductor have been already in practical use. The on-state resistance of the power MISFET with a withstand voltage of 100 V is about 0.1Ω, whereas the on-state resistance is increased greatly when the required withstand voltage is 1 kV or higher. Although insulated-gate bipolar transistors are used to achieve such high withstand voltage, those transistors are inferior to power MISFETs in high frequency characteristics.

Here, a conventional power MISFET is described. FIG. 2A shows a principle of a conventional power MISFET using single crystal silicon. This power MISFET includes, in a p-type single crystal silicon substrate 201, a source 202 and a drain 205 formed by diffusion of an n-type impurity. The source 202 and the drain 205 are provided with a source electrode 206 and a drain electrode 207, respectively. In addition, over the substrate, a gate electrode 204 and an interlayer insulator 208 are provided. A portion between the source 202 and the drain 205 and below the gate electrode serves as a channel formation region.

These structural elements are similar to those of normal MISFETs; however, in addition to these elements, a drift region 203 is provided between the drain 205 and a channel formation region in this power MISFET. The drift region 203 is provided in order to absorb a high voltage applied between the drain 205 and the gate electrode 204 in the MISFET when the MISFET is turned off.

In other words, when high voltage is applied, the drift region is depleted to be an insulator. In this state, an electric field with a voltage lower than or equal to the withstand voltage of silicon is applied to the region, so that the MISFET is prevented from being broken. Since the breakdown field strength of silicon is 0.3 MV/cm, a drift region of a MISFET which ensures a withstand voltage of 3 kV needs a width $X_1$ of 100 μm.

On the other hand, the drift region should have an n-type conductivity because it should be conductive when the MISFET is turned on; however, when the donor concentration is too high, this region cannot be depleted sufficiently. The donor concentration is preferably $4 \times 10^{13}$ cm$^{-3}$.

The resistivity of single crystal silicon whose donor concentration is $4 \times 10^{13}$ cm$^{-3}$ is 100 Ωcm or more. When the drift region 203 is formed in a shallow portion of one surface of the substrate 201 as shown in FIG. 2A, the resistance of the drift region 203 becomes high; when a drift region 213 is formed in most part of a substrate 211 so that the cross-sectional area where current flows is increased as shown in FIG. 2B, the resistance of the drift region 213 can be lowered.

In general, in order to obtain a MISFET having ten times as high withstand voltage as the original MISFET, a drift region of the MISFET needs to have ten times as large thickness and 1/100 as high donor concentration as that of the original MISFET. In the drift region, 1/100 as high donor concentration results in 100 times as high resistivity. Accordingly, the MISFET has 1000 times as high on-state resistance as the original MISFET.

A withstand voltage of 3 kV can be sufficiently ensured by setting a thickness $X_1$ of the drift region 213 to 100 μm. In practice, however, it is difficult to form a drift region only in a portion within a depth of 100 μm from a surface of the substrate 211; accordingly, most of the substrate 211 (with a thickness of several hundreds of micrometers) is used as the drift region 213. The drift region 213 has high resistance as described above, and has a resistance of 5 Ωcm$^2$ (which means that the resistance per square centimeter of the cross-sectional area where current flows is 5Ω) or higher. Most of the on-state resistance of a MISFET is caused by a drift region.

Further, the fabrication of a power MISFET of this type needs many doping steps. Specifically, an n-type impurity is added to a rear surface of the substrate 211 of single crystal silicon having extremely weak n-type conductivity, so that a drain 215 is formed. Further, after a gate electrode 214 is formed, a p-type impurity is added from the front surface to form a p-type region 219 and an n-type impurity is added from the front surface to form a source 212. The impurity concentration of the drift region 213 is equal to that of the substrate. Then, a source electrode 216, a drain electrode 217, and an interlayer insulator 218 are provided.

While the drift region needs a length of 100 μm or more in the case of silicon, the width of a portion corresponding to the drift region may be 10 μm in the case of an oxide semiconductor having a band gap of 3 eV or more because its breakdown electric field strength is 3 MV/cm or more. In the case of a silicon semiconductor, however, the conductivity in an on-state can be controlled by diffusion of a slight amount of donors into the drift region; such a technique has not been established for a general oxide semiconductor.

In particular, techniques for uniformly dispersing donors in an oxide semiconductor as thick as 10 μm or more have not been developed sufficiently. Besides, no technique is known for processing an oxide semiconductor into a wafer substrate having a uniform donor concentration like a silicon semiconductor substrate.

It has been known that in an oxide semiconductor, hydrogen serves as a donor, and an oxygen vacancy also becomes a factor of a donor. However, the inventor knows that hydrogen existing in an oxide semiconductor causes a serious problem in reliability. On the other hand, a technique with which the concentration of hydrogen, oxygen vacancies, or other donor impurities can be controlled with accuracy has not been found yet.

In the examples in FIGS. 2A and 2B, an n-channel region and a p-channel region are formed in a semiconductor substrate; however, it is generally difficult to form both an n-channel region and a p-channel region in an oxide semiconductor, though it is easy to form either of them. Therefore, it is very difficult to apply a technique relating to silicon semiconductors to oxide semiconductors.

In this point, the inventor has studied the operation of a MISFET using an oxide semiconductor, and thus has found out that the following structure enables the MISFET to have a desirable withstand voltage and enables sufficient current to flow in an on-state. The inventor also found out that a power MISFET with an excellent heat dissipation property can be provided by use of an oxide semiconductor, which can be formed over a variety of substrates.

One embodiment of the present invention focuses on the withstand voltage of an oxide semiconductor having a band gap of 3 eV or more, and provides a highly-efficient power MISFET whose on-state resistance is lower than 5 $\Omega\text{cm}^2$, preferably 1 $\Omega\text{cm}^2$ or lower even at a withstand voltage of 3 kV, for example, with the use of such an oxide semiconductor. Needless to say, these specific values do not limit the present invention.

An object of one embodiment of the present invention is to provide a novel semiconductor device. Another object of one embodiment of the present invention is to provide a novel method for fabricating a semiconductor device. Still another object of one embodiment of the present invention is to provide a novel method for driving a semiconductor device.

One embodiment of the present invention is a power MISFET including a first oxide semiconductor layer, a first electrode formed on the first oxide semiconductor layer with a first insulating layer provided therebetween, a second oxide semiconductor layer that is formed on a side surface of the first electrode with a second insulating layer provided therebetween and is in contact with the first oxide semiconductor layer, a third insulating layer covering the second oxide semiconductor layer, a second electrode in contact with the second oxide semiconductor layer, and a third electrode in contact with the first oxide semiconductor layer. The distance between the first insulating layer and the third electrode is longer than that between the second insulating layer and the third insulating layer.

One embodiment of the present invention is a power MISFET including a flat-plate-like first electrode including a hole, a first oxide semiconductor layer facing one surface of the first electrode, and a second oxide semiconductor layer provided adjacent to a side surface of the hole in the first electrode to be in contact with the first oxide semiconductor layer through the hole in the first electrode. An insulating layer is provided between the first electrode and the first oxide semiconductor layer and between the first electrode and the second oxide semiconductor layer. The first oxide semiconductor layer is thicker than the second oxide semiconductor layer.

One embodiment of the present invention is a power MISFET including a flat-plate-like first oxide semiconductor layer, a first electrode which is provided on one surface of the first oxide semiconductor layer and is insulated from the first oxide semiconductor layer, a film-like second oxide semiconductor layer which is provided to cover a side surface of the first electrode and is insulated from the first electrode, a second electrode in contact with the second oxide semiconductor layer, and a third electrode in contact with the other surface of the first oxide semiconductor layer. The second oxide semiconductor layer is in contact with the first oxide semiconductor layer. The first oxide semiconductor layer is thicker than the second oxide semiconductor layer.

In the above, an insulator may be provided to cover the second oxide semiconductor layer, and the second electrode may be in contact with the second oxide semiconductor layer through an opening formed in the insulator. In that case, the opening may be provided to overlap with the first electrode.

In the above, the first oxide semiconductor layer may be formed on any of an insulator, p-type single crystal silicon, n-type single crystal silicon, and a conductor, using it as a substrate. The first to third electrodes may be formed using a metal, a conductive oxide, or a conductive nitride.

Between the second electrode and the third electrode of such a power MISFET, a power source of 500 V or more and a load are connected in series, and a control signal is input to the first electrode. That is, the first electrode, the second electrode, and the third electrode function as a gate electrode, a source electrode, and a drain electrode, respectively.

The concentration of carriers derived from donors or acceptors in the first oxide semiconductor layer may be $1\times10^{12}$ cm$^{-3}$ or lower, preferably $1\times10^{11}$ cm$^{-3}$ or lower. In this specification, a semiconductor the carrier concentration of which is $1\times10^{12}$ cm$^{3}$ or lower is also referred to as an i-type semiconductor.

Note that when an oxide semiconductor is in contact with a conductor, carriers are injected from the conductor or absorbed into the conductor as described below; therefore, it is difficult to know the concentration of carriers derived from donors or acceptors.

Accordingly, it is actually difficult to know the concentration of only carriers derived from donors or acceptors in an oxide semiconductor layer of a MISFET. In such a case, it is possible to know whether or not the carrier concentration is $1\times10^{12}$ cm$^{-3}$ or lower by measuring a point of an oxide semiconductor layer formed in the same manner as the oxide semiconductor layer used in the MISFET, which is 10 μm or more away, preferably 100 μm or more away from a conductor.

The concentrations of oxygen vacancies and hydrogen in an oxide semiconductor layer are preferably small. This is because oxygen vacancy or mixing of hydrogen generates carriers. Further, mixing of hydrogen causes unstable operation of a MISFET. The hydrogen concentration is preferably $1\times10^{18}$ cm$^{-3}$ or lower.

In addition, the work function of the second electrode (or the third electrode) is preferably lower than the sum of the electron affinity of the second oxide semiconductor layer (or the first oxide semiconductor layer) and 0.3 eV (i.e., electron affinity+0.3 eV). Alternatively, the contact between the second electrode (or the third electrode) and the second oxide semiconductor layer (or the first oxide semiconductor layer) is preferably an ohmic contact. In addition, the work function of the third electrode is preferably higher than that of the second electrode.

Moreover, the work function of the first electrode is preferably higher than that of the second electrode (or the third electrode) by 0.3 eV or more. Alternatively, the work function of the first electrode is preferably higher than the sum of the electron affinity of the first oxide semiconductor layer (or the second oxide semiconductor layer) and 0.6 eV (i.e., electron affinity+0.6 eV).

In the case where a first conductor layer with an extremely small thickness of several nanometers or less and a second conductor layer with a comparatively large thickness are stacked over a semiconductor layer in this order, for example, the influence of the work function of the first conductor layer is considerably reduced. The same applies to an electrode having an insulating layer between the electrode and a semiconductor layer, such as a gate electrode. Therefore, in application of the present invention, the design may be performed so that the work function of each material at a position that is 5 nm away from an interface with the semiconductor layer satisfies favorable conditions in the present invention.

As apparent from the description below, the power MISFET of one embodiment of the present invention has sufficient withstand voltage and low on-state resistance. Specifically, the power MISFET of one embodiment of the present invention is different from a known power MISFET using a silicon semiconductor in that there is no need to form an n-type region or a p-type region by doping. The fabrication process can be thus simplified.

One embodiment of the present invention is particularly effective for a semiconductor material in which, substantially, only electrons or holes are used as carriers. In other words, a power MISFET capable of sufficient performance can be obtained in one embodiment of the present invention, for example, even in the case where the mobility of electrons or holes is 1 cm$^2$/V·s or higher whereas the mobility of the other is 0.01 cm$^2$/V·s or lower, the other do not exist as carriers, or the effective mass of electrons or holes is 10 times or more that of the other.

DETAILED DESCRIPTION OF THE INVENTION

Figure 1A:
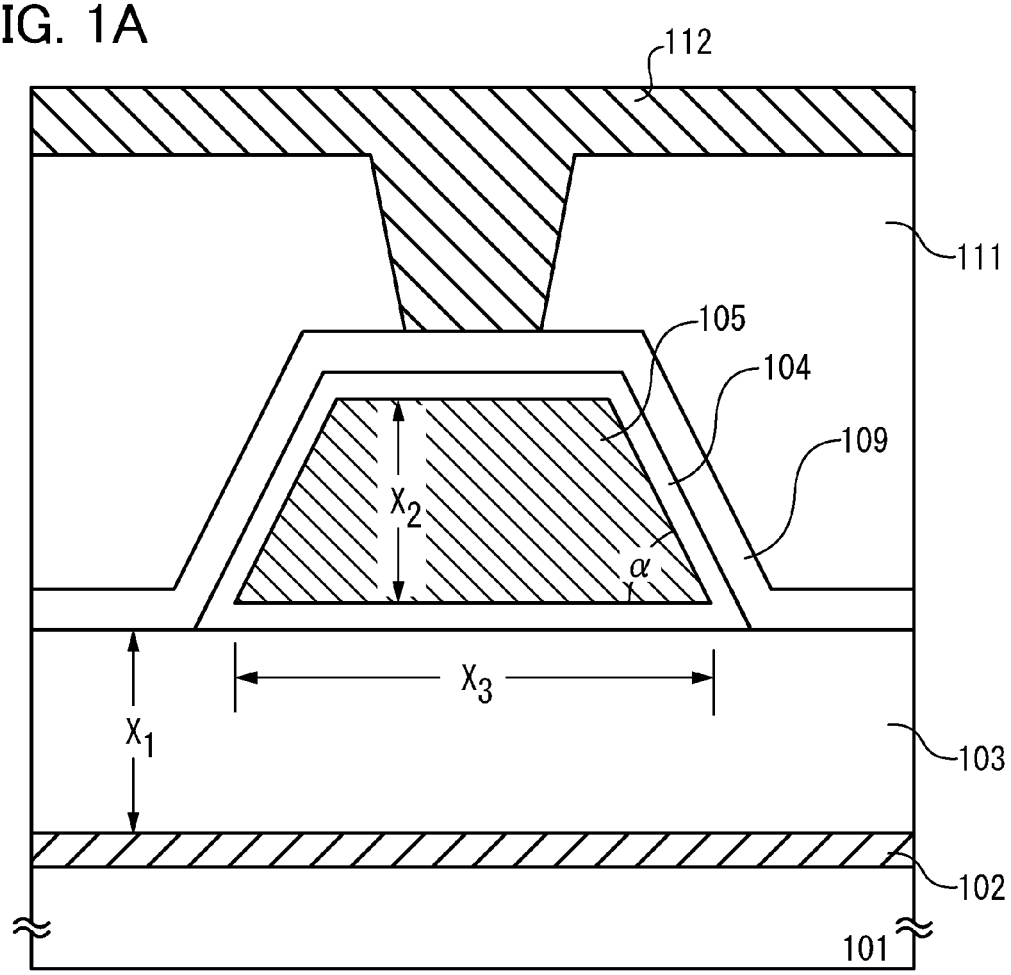
FIGS. 1A and 1B illustrate an example of a power MISFET according to one embodiment of the present invention.

Hereinafter, embodiments will be described with reference to the drawings. However, the embodiments can be implemented with various modes. It will be readily appreciated by those skilled in the art that modes and details can be changed in various ways without departing from the spirit and scope of the present invention. The present invention therefore should not be construed as being limited to the description of the embodiments. Note that in structures described below, the same portions or portions having similar functions are denoted by the same reference numerals in different drawings, and detailed description of such portions is not repeated in some cases.

Embodiment 1

FIG. 1A illustrates an example of a power MISFET. This power MISFET includes a layer-like drain electrode 102 provided over a substrate 101, a flat-plate-like i-type semiconductor layer 103 including an oxide semiconductor and having a thickness $X_1$, a gate electrode 105 having a trapezoidal cross section with a height $X_2$, a width $X_3$, and a taper angle α, and a film-like i-type semiconductor layer 109 including an oxide semiconductor and covering the gate electrode 105.

An insulating layer 104 is provided between the gate electrode 105 and the semiconductor layer 103 and between the gate electrode 105 and the semiconductor layer 109 to function as a gate insulating film. Further, an interlayer insulator 111 is provided to cover the semiconductor layer 109. A source electrode 112 is in contact with the semiconductor layer 109 through an opening provided in the interlayer insulator 111.

Figure 1B:
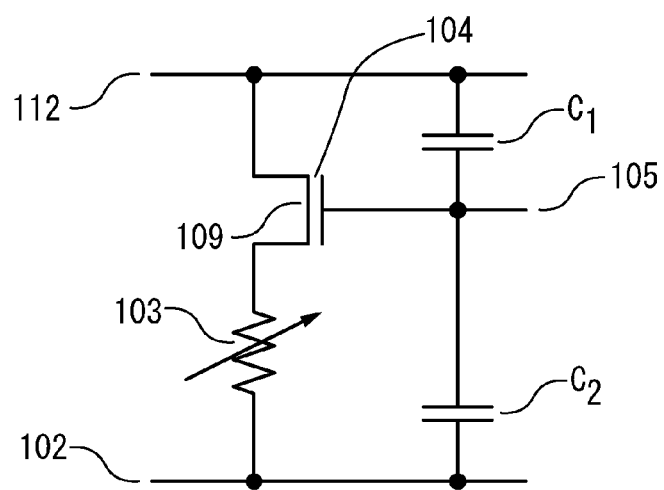

FIG. 1B illustrates a circuit of this semiconductor device. Here, the thickness $X_1$ of the semiconductor layer 103 is an important factor in setting the withstand voltage of this power MISFET. For example, $X_1$ should be set to 10 μm when an In—Ga—Zn-based oxide described below is used as the oxide semiconductor included in the semiconductor layer 103 and the withstand voltage is set to 3 kV.

In this MISFET, a channel is formed in the semiconductor layer 109. The channel length of the MISFET is determined mainly by the lengths of a top surface and a side surface of the gate electrode 105. When the channel length is not large enough compared with the thickness of the semiconductor layer 109, off-state leakage current is not sufficiently low because of a short-channel effect. When the channel length is increased, however, on-state current is decreased.

In an FET not using a PN junction, off-state leakage current is increased when the thickness of a semiconductor layer in a channel portion is large relative to a channel length. This effect relates to not only the thickness of the semiconductor layer but also an effective thickness of a gate insulating film (physical thickness of the gate insulating film×relative permittivity of the semiconductor layer/relative permittivity of the gate insulating film).

When the sum of the thickness of the semiconductor layer in the channel portion and the effective thickness of the gate insulating film is half or more of the channel length, the threshold voltage is lowered and subthreshold characteristics are degraded. In other words, the off-state current between the source electrode and the drain electrode is increased. When the MISFET shown in FIGS. 1A and 1B is in such a state, a high voltage is applied to the insulating layer 104 in an off state, so that the power MISFET is broken.

Although the details are omitted, the sum of the thickness of the semiconductor layer in the channel portion and the effective thickness of the gate insulating film may be one third or less, preferably one fifth or less of the channel length. The thickness of the semiconductor layer 109 is thus much smaller than the thickness of the semiconductor layer 103; in general, the semiconductor layer 103 is 100 times or more as thick as the semiconductor layer 109.

It is difficult to form the semiconductor layer 109 on the side surface of the gate electrode 105 when the taper angle α is large (close to perpendicular), whereas a large area is needed to form the MISFET when the taper angle α is small (close to horizontal). Accordingly, there are preferred values for the thickness of the semiconductor layer 109, the height $X_2$ of the gate electrode 105, and the taper angle α.

The maximum voltage between the source electrode 112 and the gate electrode 105 is generally less than 50 V; thus, the semiconductor layer 109 and the insulating layer 104 that are provided between the source electrode 112 and the gate electrode 105 are preferably designed to be able to withstand that voltage. For example, the thickness of the semiconductor layer 109, the height $X_2$ of the gate electrode 105, and the taper angle α may be set in the range of 5 nm to 30 nm, in the range of 0.5 μm to 10 μm, and in the range of 30° to 90°, respectively. In particular, the taper angle α is preferably set in the range of 40° to 70° in view of the fabrication process and the formation area of the MISFET.

For example, when the maximum voltage between the source electrode 112 and the gate electrode 105 is 30 V, the insulating layer 104 needs a thickness of 100 nm or more in the case of using silicon oxide. Here, when the thickness of the semiconductor layer 109 is 30 nm, the channel length is preferably set to 2 μm or more in order to obtain sufficient off-sate current characteristics. To set the length of the side surface of the gate electrode 105 to 2 μm, the height $X_2$ of the gate electrode 105 may be set to about 1.73 μm when the taper angle α is 60°.

Figure 4C:
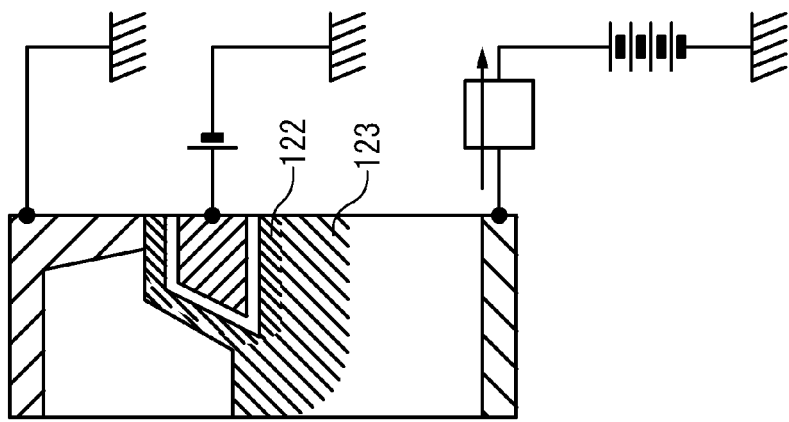
FIGS. 4A to 4C illustrate an example of the operation of a power MISFET according to one embodiment of the present invention.

The operation of such a power MISFET is described. In the power MISFET, the source electrode 112 is grounded, and a load 113 and a high-voltage power source are connected in series to the drain electrode 102, as illustrated in FIG. 4A. The drain electrode 102 is connected so that a positive voltage is applied thereto. A signal for turning the MISFET on or off, the potential of which is close to the ground potential, is supplied to the gate electrode 105. Note that the load is not limited to a mere resistor, and may be an inductor, a transformer, a transistor (including a power MISFET), or the like.

There have been almost no reports on an oxide semiconductor which includes zinc or indium, and has p-type conductivity. Accordingly, an FET using a PN junction like an FET of silicon has not been reported, and a conductor-semiconductor junction as disclosed in Patent Document 1 and Patent Document 2, where a conductor electrode is in contact with an n-type oxide semiconductor, has been used for forming a source or a drain.

When an i-type oxide semiconductor in which the concentration of carriers derived from donors is lowered by decreasing the donors is used for a MISFET, the MISFET can have high reliability, a large on/off ratio, and a small subthreshold value (see Patent Document 3). The operation of such a MISFET using an oxide semiconductor having a low donor concentration is studied below.

In a MISFET where a source and a drain are formed using a conductor-semiconductor junction, when the carrier concentration in a semiconductor used is high, current (off-state current) flows between the source and the drain even in an off state. Therefore, an i-type semiconductor is obtained by lowering the carrier concentration in the semiconductor, so that the off-state current can be reduced.

In a conductor-semiconductor junction, in general, an ohmic junction or a Schottky barrier junction is formed depending on the relation between a work function of a conductor and an electron affinity (or a Fermi level) of a semiconductor. For example, if an ideal conductor-semiconductor junction (i.e., no chemical reactions or no carrier traps at the junction interface) is formed by making a conductor with a work function of 3.9 eV in contact with a semiconductor with an electron affinity of 4.3 eV, electrons flow from the conductor into a region with a certain width in the semiconductor.

In that case, a region closer to a junction interface between the conductor and the semiconductor has a higher electron concentration, and the electron concentrations are $1 \times 10^{20}$ cm$^{-3}$ at several nanometers from the interface of the conductor-semiconductor junction, $1 \times 10^{18}$ cm$^{-3}$ at several tens of nanometers from the interface, $1 \times 10^{16}$ cm$^{-3}$ at several hundreds of nanometers from the interface, and $1 \times 10^{14}$ cm$^{-3}$ even at several micrometers from the interface according to rough calculation. That is, even when the semiconductor itself is an i-type semiconductor, a contact with a conductor produces a region with a high carrier concentration. Formation of such a region including many electrons in the vicinity of the interface of the conductor-semiconductor junction can make the conductor-semiconductor junction an ohmic junction.

In contrast, for example, if an ideal conductor-semiconductor junction is formed by making a conductor with a work function of 4.9 electron volts in contact with a semiconductor with an electron affinity of 4.3 electron volts, electrons existing in a region with a certain width in the semiconductor move to the conductor. In the region where the electrons have been depleted, the electron concentration is, as is obvious, extremely low. The width of the region of the semiconductor from which electrons move depends on the electron concentration of the semiconductor; for example, when the original electron concentration of the semiconductor is $1 \times 10^{18}$ cm$^{-3}$, the width is about several tens of nanometers.

The electron concentration in this portion becomes significantly low; accordingly, a barrier is formed at a junction interface between the conductor and the semiconductor in a band diagram. A conductor-semiconductor junction including such a barrier is referred to as a Schottky barrier junction. Electrons easily flow from the semiconductor to the conductor, whereas electrons are less likely to flow from the conductor to the semiconductor owing to the barrier. Therefore, rectification effect is observed in the Schottky barrier junction.

A similar phenomenon occurs even when a conductor is not in direct contact with a semiconductor. For example, even in the case where an insulating film is provided between a semiconductor and a conductor, the electron concentration of the semiconductor is influenced by the conductor. Needless to say, the degree of the influence of the conductor depends on the thickness or the dielectric constant of the insulating film. When the thickness of the insulating film is increased or when the dielectric constant thereof is lowered, the influence of the conductor is reduced.

It is preferable that a junction between a source electrode and a semiconductor or between a drain electrode and the semiconductor be formed so that current flows easily; thus, a conductive material is selected for the source electrode or the drain electrode so that an ohmic junction is formed. For example, titanium and titanium nitride are given. When a junction between an electrode and a semiconductor is an ohmic junction, a MISFET having stable characteristics is fabricated and high percentage of non-defective products is achieved.

As a material of a gate electrode, a material having an effect of eliminating electrons from a semiconductor is selected. For example, nickel and platinum are given. Alternatively, a conductive oxide such as molybdenum oxide may be used. Some of conductive oxides have work functions of 5 eV or higher. Because such materials are possibly inferior in conductivity, they are preferably used in combination with a material with high conductivity in a stacked layer. Conductive nitrides such as indium nitride and zinc nitride are also preferable because they have work functions of 5 eV or more as well.

As described above, electrons intrude into the semiconductor layer owing to the contact with the conductor; however, for example, as in the power MISFET illustrated in FIG. 1A, when the thickness $X_1$ of the semiconductor layer 103 corresponding to the drift region is 10 μm and there is no potential difference between the source electrode 112 and the drain electrode 102, the average electron concentration of the semiconductor layer 103 is estimated to be about $2 \times 10^{13}$ cm$^{-3}$. This value is equivalent to the donor concentration of the drift region 203 of the conventional power MISFET in FIG. 2A having a withstand voltage of 3 kV or the donor concentration of the drift region 213 illustrated in FIG. 2B.

Figure 4B:
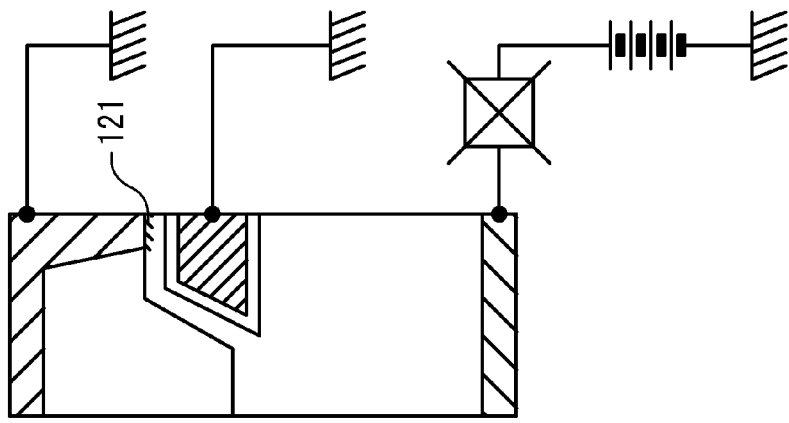
Figure 4A:
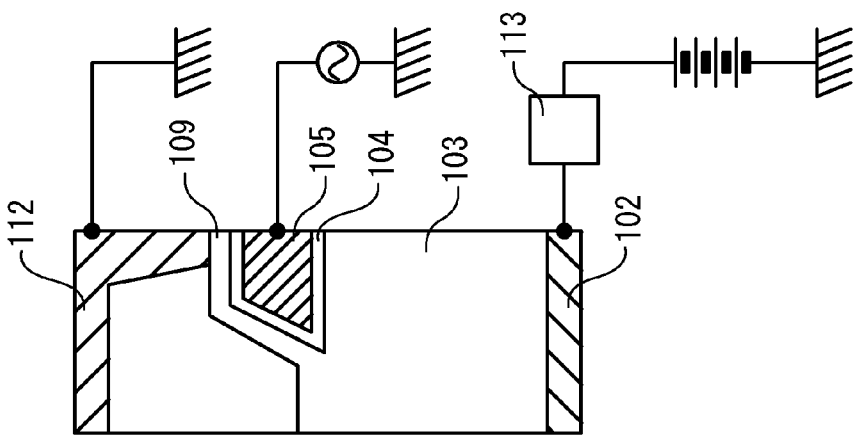

FIG. 4B schematically illustrates electron states of the power MISFET in an off state. In the off state, electrons are likely to flow into the semiconductor layer 109 from the source electrode 112 which is in ohmic contact with the semiconductor layer 109, but are forced to remain in the source electrode and the vicinity thereof by the gate electrode 105 (kept at the ground potential (0 V)) having a high work function. A region 121 with high electron concentration is formed in the vicinity of the source electrode 112 as shown in FIG. 4B, while electrons are not diffused into the other regions. Thus, the regions other than the region 121 with high electron concentration have extremely high resistance.

Since electrons are not supplied to the semiconductor layer 103 from the source electrode 112, the semiconductor layer 103 is easily depleted, and a voltage applied between the drain electrode 102 and the gate electrode 105 is absorbed in this depleted semiconductor layer 103. Since the thickness of the semiconductor layer 103 is set such that it can withstand that voltage, the MISFET is not broken. The depleted semiconductor layer 103 has extremely high resistance, so that almost no current flows through the load 113.

Although the voltage of the gate electrode 105 is 0 V in FIG. 4B, it may be set to an appropriate negative value to further improve off-state characteristics.

FIG. 4C schematically illustrates electron states of the power MISFET in an on state. The gate electrode 105 is kept at a positive voltage, so that a region 122 with extremely high electron concentration and a region 123 with comparatively high electron concentration are formed in the semiconductor layer 109 and the semiconductor layer 103 around the gate electrode 105. Consequently, a channel is formed in the semiconductor layer 109, so that electrons from the source electrode 112 can reach the semiconductor layer 103. Therefore, the resistance between the source electrode and the drain electrode of the power MISFET is sufficiently lower than the resistance of the load 113, so that the potential of the drain electrode is 10 V or lower, for example, and most of the voltage of the power source is applied to the load 113.

It is to be noted here that the region 122 with extremely high electron concentration and the region 123 with comparatively high electron concentration are formed also in the semiconductor layer 103. This is because the gate electrode 105 is kept at a positive voltage.

The average electron concentration of the semiconductor layer 103, which is dependent on the voltage of the gate electrode 105, is about $2 \times 10^{14}$ cm$^{-3}$ when the voltage of the gate electrode 105 is 10 V while the average electron concentration of the semiconductor layer 103 is about $2 \times 10^{13}$ cm$^{-3}$ under the condition where the influence of the gate electrode 105 is ignored and the voltage of the drain electrode 102 is 0 V. The resistance of the semiconductor layer 103 in the former case is obviously low as compared with the latter case.

Figure 2A:
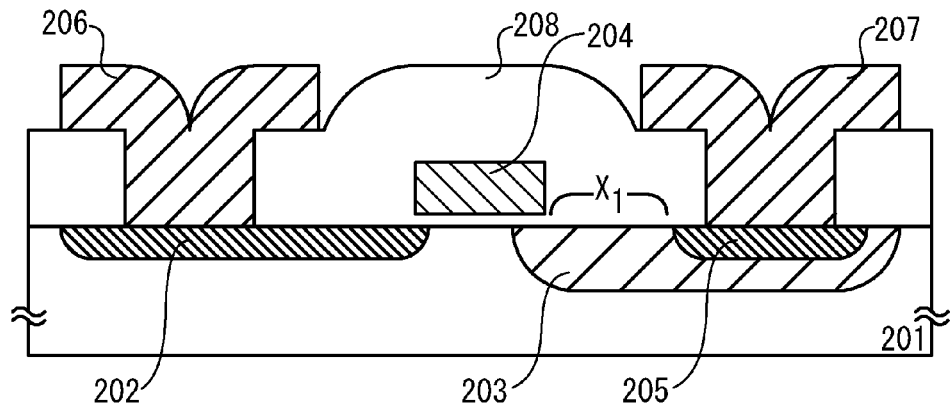
FIGS. 2A and 2B each illustrate an example of a conventional power MISFET.
Figure 2B:
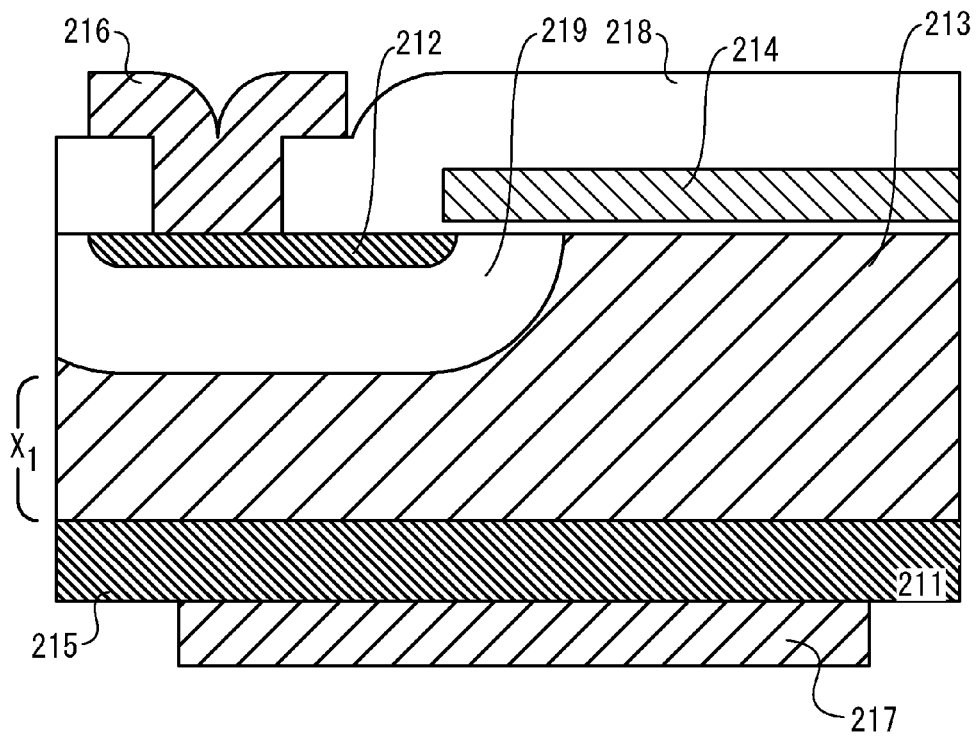

Note that a similar phenomenon occurs in the conventional power MISFET in FIG. 2B, but in that case, the drift region 213 needs a thickness $X_1$ of 100 μm or more, so that the average concentration of electrons induced in the drift region 213 by the gate electrode 214 is about $2 \times 10^{12}$ cm$^{-3}$ at maximum, which is much lower than the concentration of electrons generated by donors which are added to the drift region 213 (about $4 \times 10^{13}$ cm$^{-3}$); thus, almost no effect of the gate electrode 214 is observed.

When a material with even lower work function is used as a material of the drain electrode 102, more electrons can be supplied to the semiconductor layer 103 from the drain electrode 102, which is preferable in terms of reducing the resistance of the semiconductor layer 103. Electrons supplied to the semiconductor layer 103 from the drain electrode 102 are absorbed in the drain electrode 102 when the voltage of the drain electrode 102 is higher than several volts, and thus it does not inhibit depletion of the semiconductor layer 103 in an off state.

As a material with low work function, n-type gallium nitride with sufficiently high electron concentration or n-type gallium oxide with sufficiently high electron concentration may be used. These materials have conductivity and a work function of about 3.5 eV. Further, gallium that is included in these materials is also used in an oxide semiconductor, so that when the semiconductor layer 103 is formed using an oxide containing gallium, discontinuity at the interface can be avoided, leading to suppression of variations in yield and/or characteristics of products.

On the other hand, high electron concentration in the vicinity of the source electrode 112 is a factor of a decrease in the withstand voltage particularly in an off state. Therefore, as the material of the source electrode 112, a material having a work function higher than that of a material of the drain electrode 102 is preferably used.

If the work functions of the gate electrode 105 is not sufficiently high, the region 121 with high electron concentration in the vicinity of the source electrode 112 expands to the drain electrode 102 side, and some electrons flows into the drain electrode 102 from the source electrode 112. In that case, a high voltage is applied to the insulating layer 104, so that the element might be broken. Accordingly, the work function of the gate electrode 105 is important.

In the conventional power MISFET using a silicon semiconductor that is shown in FIGS. 2A and 2B, the above problem is avoided by forming a reverse PN junction between the source 202 (or the source 212) and the channel formation region. A PN junction cannot be employed in a power MISFET using an oxide semiconductor; thus, a material having high work function is preferably used for the gate electrode 105. Alternatively, the potential of the gate electrode 105 is preferably set to be lower than that of the source electrode 112 by one volt or more in an off state.

As apparent from the above consideration, the withstand voltage of the MISFET illustrated in FIG. 1A is sufficient. In addition, the thickness of the region corresponding to the drift region is one tenth of the length of the drift region in the case of a silicon semiconductor, so that the on-state resistance can be decreased.

Figure 3A:
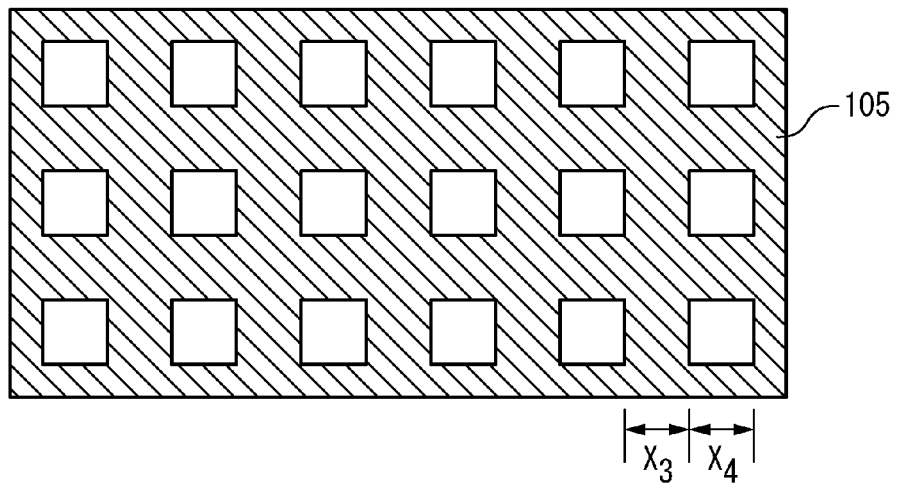
FIGS. 3A to 3C each illustrate an example of the shape of an electrode of a power MISFET according to one embodiment of the present invention.
Figure 3B:
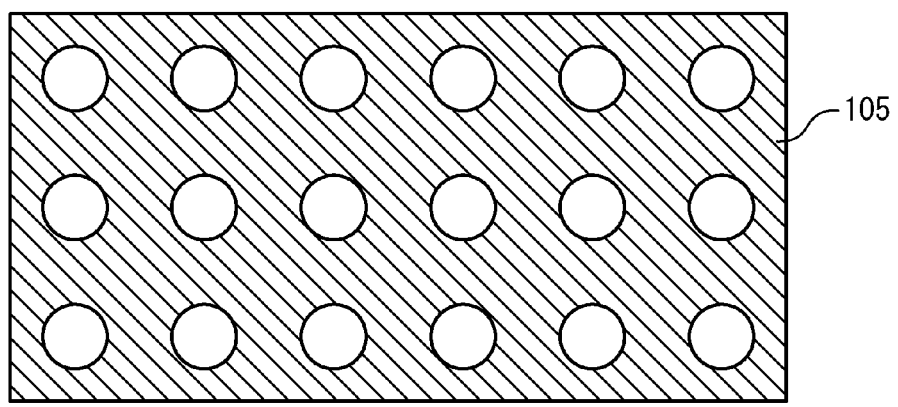
Figure 3C:
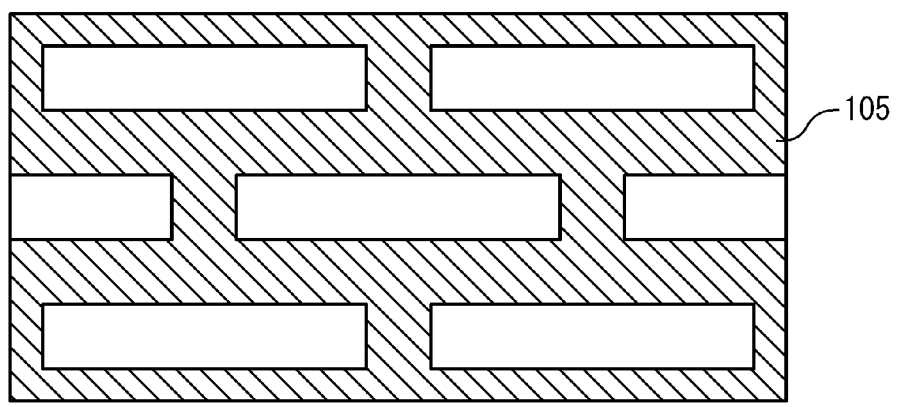

Although one gate electrode 105 is illustrated in the MISFET in FIG. 1A, a plurality of similar gate electrodes are preferably formed over the semiconductor layer 103. For example, a flat-plate-like conductor provided with a plurality of holes may be used as the gate electrode 105. FIGS. 3A to 3C show such examples.

In FIG. 3A, a flat-plate-like conductor provided with square holes is used as the gate electrode 105. This gate electrode is formed over the semiconductor layer 103, and the semiconductor layer 109 is formed thereover to fill the holes. The semiconductor layer 109 is in contact with the semiconductor layer 103 through the holes. The portion where the source electrode 112 is in contact with the semiconductor layer 109 is preferably provided so as to overlap with the gate electrode 105. The cross section is similar to that shown in FIG. 1A.

In calculation, when the height $X_2$ of the gate electrode 105 is 1.73 μm, the taper angle α is 60° (i.e., the channel length is 2 μm), the length $X_4$ of one side of a bottom surface of the hole that is formed in the gate electrode 105 is 2 μm, and the distance between adjacent holes (i.e., the width $X_3$ of the gate electrode 105) is 2 μm in the MISFET in FIG. 1A, the number of holes formed in a 1 cm square is 6,250,000.

Since the periphery of the hole is the channel width, the channel width per hole is 8 μm; accordingly, the channel width of the power MISFETs formed in a 1 cm square is 50 m, which is 6,250,000 times 8 μm. The on-state resistance of a MISFET in which the channel length is 2 μm, the channel width is 1 μm, the gate insulator is a 100-nm-thick silicon oxide film, and the mobility of the semiconductor layer is 10 cm²/V·s, is calculated to be 2 MΩ or less when the voltage of the gate electrode is set to 10 V. The MISFETs formed in the plurality of holes have a channel width of 50 m, thus having an on-state resistance of 40 mΩ or less.

In the power MISFET, the resistance of the semiconductor layer 103 corresponding to the drift region needs to be considered. When the mobility of the semiconductor layer 103 is 10 cm²/V·s, the resistance of the semiconductor layer 103 per square centimeter is about 3Ω in an on state, which is sufficiently higher than the above resistance. Accordingly, it is found that most of the resistance of the power MISFET is caused by the semiconductor layer 103. Needless to say, the resistance of the semiconductor layer 103 can be reduced as the mobility is increased.

The shape of the hole provided in the gate electrode 105 is not limited to a square, and may be a circle as shown in FIG. 3B or a rectangular as shown in FIG. 3C, or may be other shapes. When the area occupied by the holes is reduced, the resistance of the gate electrode 105 is reduced, while the capacitance between the gate electrode 105 and the drain electrode 102 (denoted by $C_2$ in FIG. 1B) is increased. In addition, the channel width is increased as the periphery of the hole is increased; however, there is little advantage in increasing the periphery of the hole to increase the channel width when the resistance of the semiconductor layer 103 is predominant as described above.

Note that, as shown in FIG. 1B, capacitance $C_1$ is caused between the source electrode 112 and the gate electrode 105 in this power MISFET. The smaller the capacitance $C_1$ is, the faster the power MISFET can operate. The capacitance $C_1$ is formed mainly between a portion where the source electrode 112 is in contact with the semiconductor layer 109 and the gate electrode 105; accordingly, the capacitance $C_1$ can be reduced by reducing the area of this portion (or the number of contact portions).

However, a reduction in the area of the portion where the source electrode 112 is in contact with the semiconductor layer 109 leads to an increase in contact resistance of this portion, causing another problem: an increase in series resistance of the source electrode. Therefore, the area and the number of the portions where the source electrode 112 is in contact with the semiconductor layer 109 should be determined in consideration of these factors.

Note that the substrate 101 may be any of an insulator, a semiconductor, and a conductor, and preferably has high thermal conductivity. When the substrate 101 is formed using a conductor, the substrate 101 may double as a member corresponding to the drain electrode 102. The temperature required for formation of an oxide semiconductor is lower than or equal to 600° C.; thus, any of a variety of materials can be used for the substrate 101. Accordingly, a power MISFET with excellent heat dissipation property can be provided.

It is necessary that the power MISFET does not generate excessive heat in order to obtain stable characteristics. In general, off-state current of a MISFET is increased when used in a high temperature. Since an increase in off-state current leads to a breakdown of a circuit in a power MISFET, excessive heat generation should be avoided as much as possible.

In a conventional power MISFET, considerably thick silicon is used for a substrate, so that heat dissipation is limited. It has thus been technically difficult to make a conventional power MISFET effectively dissipate heat by providing a semiconductor layer with an appropriate thickness in contact with a substrate having high thermal conductivity as described above.

For example, copper, which has high thermal conductivity, may be used for the substrate 101, and the drain electrode may be formed using titanium nitride with a thickness of 100 nm to 1 μm. Note that an insulator or a conductor with high thermal conductivity may be provided to overlap with the source electrode 112 in order to improve the heat dissipation property. For example, a copper layer with a thickness of 1 μm to 10 μm may be formed to overlap with the source electrode 112.

In the above consideration, the semiconductor layer 103 and the semiconductor layer 109 are assumed to be i-type semiconductor layers. In order to obtain sufficient off-state resistance, the semiconductor layer 109 in the power MISFET (in particular, a portion where the channel is formed) is preferably i-type; however, the semiconductor layer 103 corresponding to the drift region is not necessarily i-type, and may include carriers derived from donors (or acceptors) at a concentration lower than or equal to the maximum carrier concentration which is determined depending on the required withstand voltage. These carriers may be introduced unintentionally.

For example, the thickness of the semiconductor layer 103 needs to be set to 10 μm in order to set the withstand voltage of the power MISFET in FIG. 1A to 3 kV, and the semiconductor layer 103 with this thickness should have a concentration of carriers derived from donors of $1 \times 10^{15}$ cm$^{-3}$ or lower to be depleted in an off state. As described below in Embodiment 2, because the semiconductor layer 103 and the semiconductor layer 109 can be formed in different steps, the semiconductor layer 109 can have an i-type conductivity and the semiconductor layer 103 can have a weak n-type conductivity.

In the power MISFET shown in FIG. 1A, unlike in a conventional power MISFET, conductivity in an on state need not be controlled with carriers derived from donors, so that accurate concentration control is unnecessary, which allows gradation (variation) in donor concentration inside the semiconductor layer 103.

Since the semiconductor layer 103 and the semiconductor layer 109 can be formed in different steps, they may have different crystallinity. For example, it is possible to use a material with comparatively high crystallinity for the semiconductor layer 103 and a material with comparatively low crystallinity for the semiconductor layer 109.

For example, it is effective to use a single crystal material with high mobility for the semiconductor layer 103 in reducing on-state resistance. Moreover, it is effective to use a semiconductor material with a larger band gap for the semiconductor layer 103 in increasing the withstand voltage and reducing the on-state resistance. Note that when the semiconductor layer 103 and the semiconductor layer 109 are formed using different materials, a gap may be caused at the bonding surface, in which case on-state resistance is increased.

An oxide semiconductor to be used preferably contains at least one of gallium (Ga), indium (In), and zinc (Zn). In particular, In and Zn are preferably contained. Further, the oxide semiconductor preferably has sufficient breakdown electric field strength, specifically higher than or equal to 2.5 MV/cm. Thus, the oxide semiconductor preferably has a band gap of 3 eV or more.

The oxide semiconductor preferably has an electron affinity greater than or equal to 4 eV and less than 5 eV. An electron affinity less than 4 eV limits the materials of the drain electrode 102 and the source electrode 112 which can form an ohmic contact with the oxide semiconductor. An electron affinity of 5 eV or more limits the material of the gate electrode which can achieve sufficient off-state characteristics.

Further, as a stabilizer for reducing variations in electrical characteristics of the power MISFET, one or more of gallium (Ga), tin (Sn), hafnium (Hf), and aluminum (Al) is preferably contained. The band gap can be set to an appropriate value by mixture of these materials.

One or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can also be used as a stabilizer.

As the oxide semiconductor, for example, any of the following can be used: indium oxide; tin oxide; zinc oxide; gallium oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than the In, Ga, and Zn.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, with an In—Sn—Zn-based oxide, high mobility can be obtained with relative ease. However, the mobility can be increased by reducing the defect density in the bulk also in the case of using an In—Ga—Zn-based oxide.

Note that for example, the expression "the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq 0.0025$. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

Embodiment 2

In this embodiment, a method for fabricating a power MISFET according to one embodiment of the present invention is described with reference to FIGS. 5A to 5C and FIGS. 6A to 6C. Note that this embodiment uses a technique in common with a method for fabricating a transistor including an oxide semiconductor; thus, Patent Documents 1 to 3 can be referred to as needed.

Figure 5A:
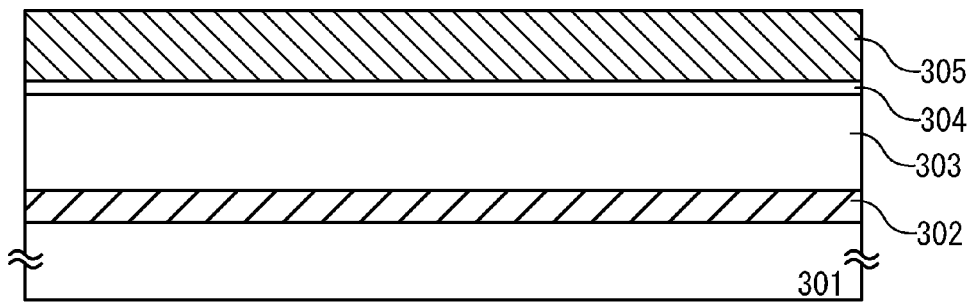
FIGS. 5A to 5C illustrate an example of a fabrication process of a power MISFET according to one embodiment of the present invention.

First, as shown in FIG. 5A, a first conductive layer 302, a first oxide semiconductor layer 303, a first insulating layer 304, and a second conductive layer 305 are formed over a substrate 301 having high thermal conductivity.

The thermal conductivity of the substrate 301 is preferably higher than or equal to 200 W/m/K, and a metal material such as gold, silver, copper, or aluminum is preferably used for the substrate 301. In particular, copper is suitably used because it has a thermal conductivity of about 400 W/m/K, which is much higher than that of silicon (about 170 W/m/K), and is inexpensive.

The first conductive layer 302, which is to be a drain electrode, is preferably formed using a material with low work function, such as aluminum containing magnesium, titanium, titanium nitride, or n-type gallium oxide. The thickness of the first conductive layer 302 may be 100 nm to 10 μm.

The second conductive layer 305, which is to be a gate electrode, is preferably formed using a material with high work function, for example, a metal such as tungsten, palladium, osmium, or platinum; a conductive oxide such as molybdenum oxide; or a conductive nitride such as indium nitride or zinc nitride. The thickness of the second conductive layer 305 is a factor which determines the channel length of the power MISFET to be fabricated. Embodiment 1 may be referred to for the details.

The first oxide semiconductor layer 303 is preferably formed using a material selected from the oxides given in Embodiment 1. Since the thickness of the first oxide semiconductor layer 303 is a factor which determines the withstand voltage of the power MISFET to be fabricated, as described in Embodiment 1, the thickness is set according to a desired withstand voltage. The first oxide semiconductor layer 303 may be formed using a single crystal material or a material with crystallinity close to that of a single crystal material.

The first insulating layer 304 is formed to insulate the first oxide semiconductor layer 303 and the second conductive layer 305 from each other. Any of a variety of insulating materials such as silicon oxide, silicon nitride, and aluminum oxide can be used for the first insulating layer 304. The first insulating layer 304 needs a thickness large enough to withstand the voltage applied to the gate electrode that is formed using the second conductive layer 305, generally a thickness of 10 nm to 1 μm. When the first insulating layer 304 is too thick, the concentration of electrons induced in the portion corresponding to the drift region is decreased, as described in Embodiment 1.

Figure 5B:
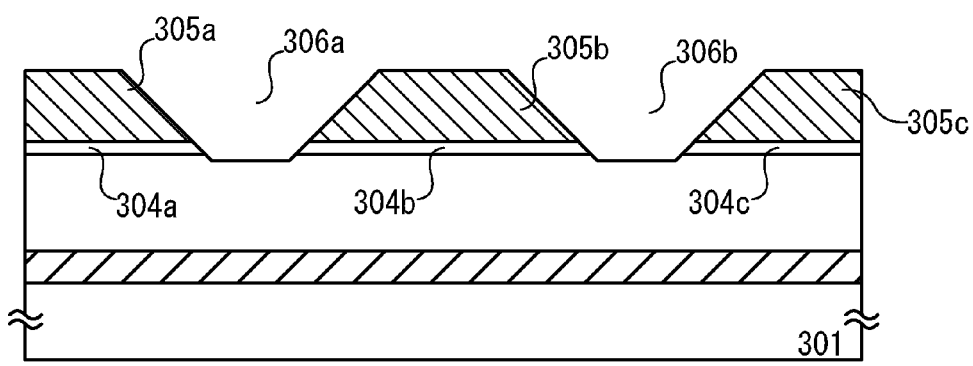

Next, as shown in FIG. 5B, the second conductive layer 305 and the first insulating layer 304 are etched to form holes 306a and 306b in the second conductive layer 305. The first oxide semiconductor layer 303 might be partly etched in this step. A gate electrode 305a, a gate electrode 305b, a gate electrode 305c, a first gate insulating film 304a, a first gate insulating film 304b, and a first gate insulating film 304c are formed through the etching.

Note that the gate electrode 305a, the gate electrode 305b, and the gate electrode 305c may be integrated with one other, any two of these may be integrated with each other, or all of these may be independent from one another. Similarly, the first gate insulating film 304a, the first gate insulating film 304b, and the first gate insulating film 304c may be integrated with one other, any two of these may be integrated with each other, or all of these may be independent from one another.

Figure 5C:
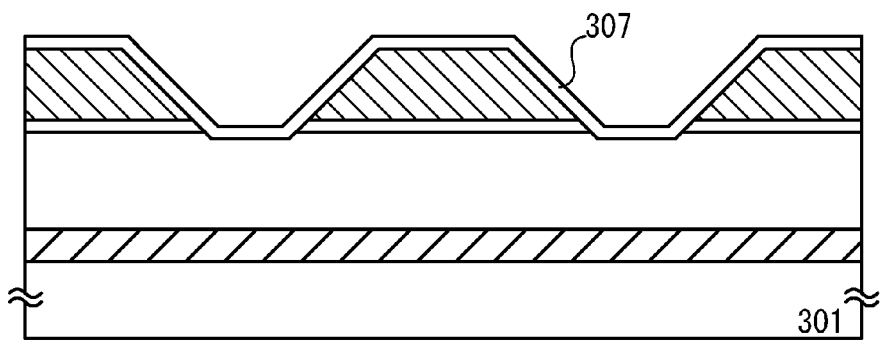

Next, a second insulating layer 307 is formed as shown in FIG. 5C. The second insulating layer 307 is formed to insulate a second oxide semiconductor layer 309, which is formed later, from the gate electrode 305a, the gate electrode 305b, and the gate electrode 305c. Any of a variety of insulating materials such as silicon oxide, silicon nitride, and aluminum oxide can be used for the second insulating layer 307.

The second insulating layer 307 needs a thickness large enough to withstand the voltage applied to the gate electrode 305a, the gate electrode 305b, and the gate electrode 305c, generally a thickness of 10 nm to 1 μm. When the second insulating layer 307 is too thick, the on-state resistance of the power MISFET to be fabricated is increased, and sufficient off-state characteristics cannot be obtained owing to a short-channel effect. Embodiment 1 may be referred to for the details.

Figure 6A:
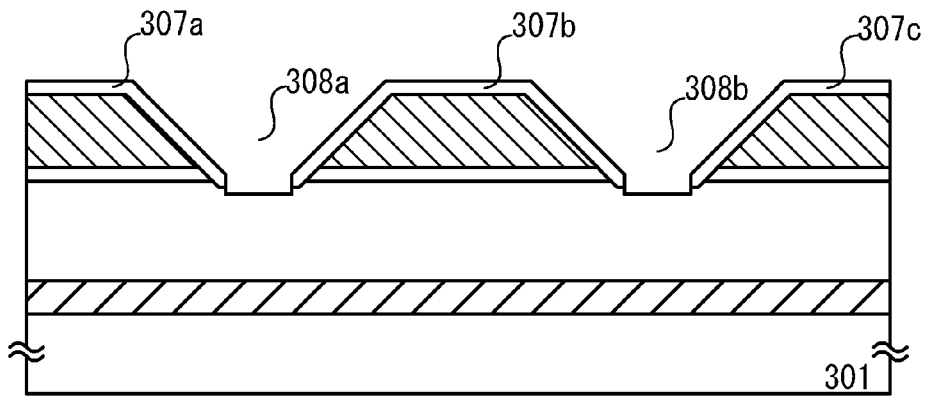
FIGS. 6A to 6C illustrate the example of the fabrication process of the power MISFET according to one embodiment of the present invention.

Next, as shown in FIG. 6A, the second insulating layer 307 is etched to form contact holes 308a and 308b which reach the first oxide semiconductor layer 303. The first oxide semiconductor layer 303 might be partly etched in this step. A second gate insulating film 307a, a second gate insulating film 307b, and a second gate insulating film 307c are formed through the etching.

Figure 6B:
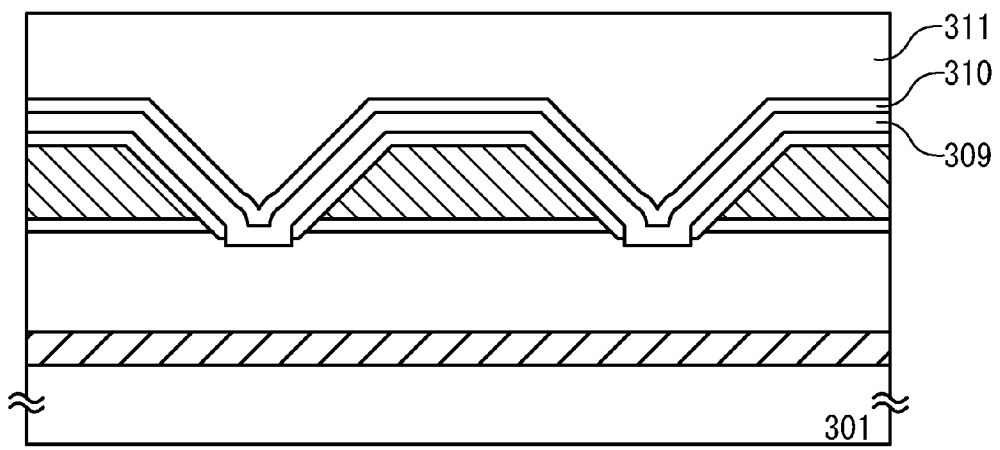

Further, as shown in FIG. 6B, the second oxide semiconductor layer 309, a third insulating layer 310, and a fourth insulating layer 311 are formed. The second oxide semiconductor layer 309 is preferably formed using a material selected from the oxides given in Embodiment 1. Since the thickness of the second oxide semiconductor layer 309 is a factor which determines the off-state characteristics of the power MISFET to be fabricated, as described in Embodiment 1, the thickness is set according to desired off-state characteristics.

The third insulating layer 310 functions as an etching stopper, and therefore is required to be etched at a lower rate (less likely to be etched) than the fourth insulating layer 311 under a condition for etching the fourth insulating layer 311. In addition, the second oxide semiconductor layer 309 is required to be etched at a lower rate than the third insulating layer 310 under a condition for etching the third insulating layer 310.

The third insulating layer 310 can be formed using the material used for the second insulating layer 307. The thickness of the third insulating layer 310 is preferably 0.5 to 2 times the thickness of the second oxide semiconductor layer 309. The fourth insulating layer 311 may be formed using an inorganic insulating material or an organic insulating material different from that used for the third insulating layer. The surface of the fourth insulating layer 311 is preferably flat. The thicker the fourth insulating layer 311, which functions as an interlayer insulating layer, becomes, the smaller the capacitance $C_1$ described in Embodiment 1 can be.

Figure 6C:
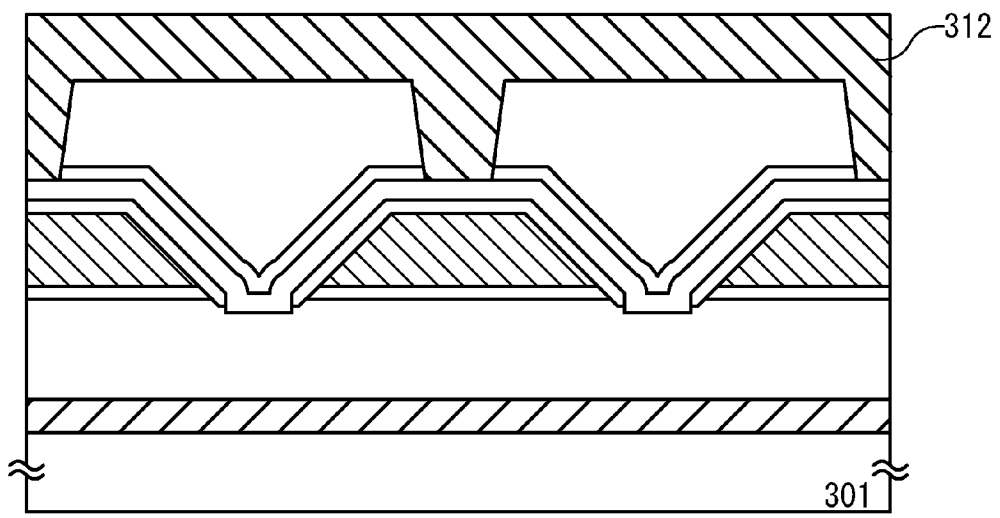

Next, as shown in FIG. 6C, the fourth insulating layer 311 and the third insulating layer 310 are etched to form contact holes which reach the second oxide semiconductor layer 309. In the formation of the contact holes, the third insulating layer 310 can be used as an etching stopper to prevent excessive etching of the second oxide semiconductor layer.

Further, a third conductive layer 312 is formed. The third conductive layer 312 is in contact with the second oxide semiconductor layer 309 through the contact holes. The third conductive layer 312, which is to be a source electrode, is preferably formed using a material with low work function, such as aluminum containing magnesium, titanium, or titanium nitride. The thickness of the third conductive layer 312 may be 100 nm to 10 μm. In this manner, a power MISFET is fabricated.

Embodiment 3

Figure 7A:
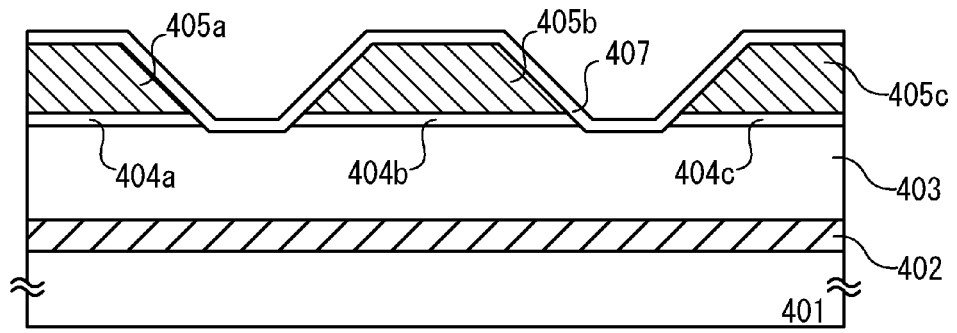
FIGS. 7A to 7C illustrate an example of a fabrication process of a power MISFET according to one embodiment of the present invention.
Figure 7B:
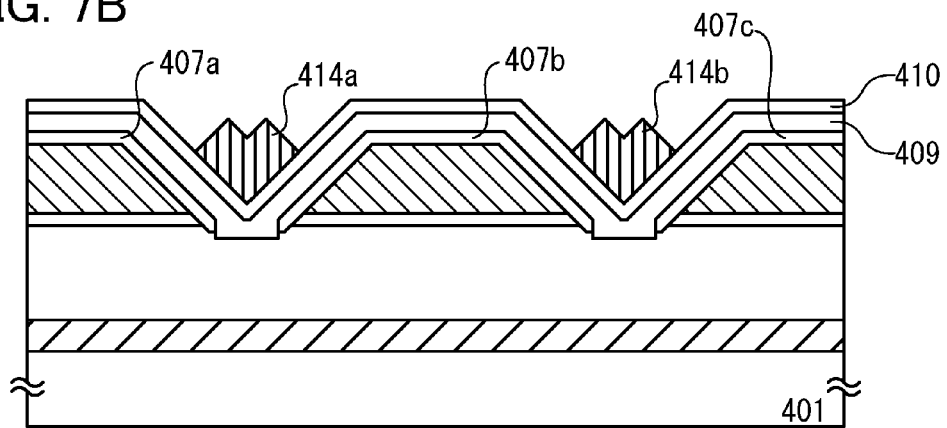
Figure 7C:
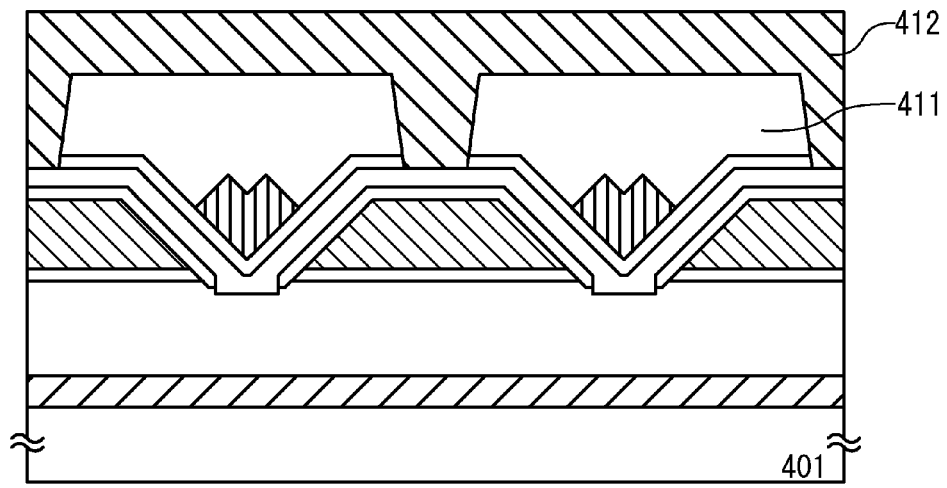

In this embodiment, a method for fabricating a power MISFET according to one embodiment of the present invention is described with reference to FIGS. 7A to 7C. Note that this embodiment uses a technique in common with a method for fabricating a transistor including an oxide semiconductor; thus, Patent Documents 1 to 3 can be referred to as needed. In addition, Embodiment 2 can be referred to.

<FIG. 7A>

As in Embodiment 2, a conductive layer 402, a first oxide semiconductor layer 403, a first gate insulating film 404a, a first gate insulating film 404b, a first gate insulating film 404c, a gate electrode 405a, a gate electrode 405b, a gate electrode 405c, and an insulating layer 407 are formed over a substrate 401 with high thermal conductivity.

<FIG. 7B>

As in Embodiment 2, the insulating layer 407 is etched to form contact holes which reach the first oxide semiconductor layer 403, and a second insulating film 407a, a second insulating film 407b, and a second insulating film 407c are formed. Further, a second oxide semiconductor layer 409 and an insulating layer 410 are formed. The insulating layer 410, which functions as an etching stopper, is preferably used also as a gate insulating film.

Next, a back gate electrode 414a and a back gate electrode 414b are formed using a conductive material over the insulating layer 410. As shown in FIG. 7B, the back gate electrode 414a and the back gate electrode 414b are formed to cover the portions where the second oxide semiconductor layer 409 is in contact with the first oxide semiconductor layer 403.

The back gate electrode 414a and the back gate electrode 414b preferably operate in synchronization with the gate electrode 405a, the gate electrode 405b, and the gate electrode 405c. The material of the back gate electrode 414a and the back gate electrode 414b may be the same as that of the gate electrode 405a, the gate electrode 405b, and the gate electrode 405c, may be the same material with different properties, or may be a different material.

<FIG. 7C>

An insulating layer 411 is formed, and the insulating layer 411 and the insulating layer 410 are etched to form contact holes which reach the second oxide semiconductor layer 409. Further, a conductive layer 412 is formed. The conductive layer 412 is in contact with the second oxide semiconductor layer 409 through the contact holes.

In this embodiment, the back gate electrode 414a and the back gate electrode 414b are provided to cover the portions where the second oxide semiconductor layer 409 is in contact with the first oxide semiconductor layer 403. Since these portions are away from the gate electrode 405a, the gate electrode 405b, and the gate electrode 405c, channels are not sufficiently formed by only the gate electrode 405a, the gate electrode 405b, and the gate electrode 405c, which leads to an increase in resistance. The back gate electrode 414a and the back gate electrode 414b provided at such positions can sufficiently form channels in an on state, thus reducing the resistance.

This application is based on Japanese Patent Application serial No. 2011-201446 filed with Japan Patent Office on Sep. 15, 2011, the entire contents of which are hereby incorporated by reference.

What is claimed is:

1. An insulated-gate field-effect transistor comprising:
a first oxide semiconductor layer;
a first electrode formed over the first oxide semiconductor layer with a first insulating layer provided therebetween;
a second oxide semiconductor layer that is formed on a side surface of the first electrode with a second insulating layer provided therebetween and is in contact with the first oxide semiconductor layer;
a third insulating layer covering the second oxide semiconductor layer;
a second electrode in contact with the second oxide semiconductor layer; and
a third electrode in contact with the first oxide semiconductor layer,
wherein a distance between the first insulating layer and the third electrode is longer than a distance between the second insulating layer and the third insulating layer.

2. The insulated-gate field-effect transistor according to claim 1,
wherein the second electrode is in contact with the second oxide semiconductor layer through an opening formed in the third insulating layer.

3. The insulated-gate field-effect transistor according to claim 1, wherein the first oxide semiconductor layer is formed on one selected from the group consisting of an insulating substrate, a p-type single crystal silicon substrate, an n-type single crystal silicon substrate, and a conductive substrate.

4. The insulated-gate field-effect transistor according to claim 1, wherein the first electrode comprises one selected from the group consisting of a metal, a conductive oxide, and a conductive nitride.

5. The insulated-gate field-effect transistor according to claim 1, wherein the second electrode comprises one selected from the group consisting of a metal, a conductive oxide, and a conductive nitride.

6. The insulated-gate field-effect transistor according to claim 1, further comprising an electrode overlapping with a portion where the second oxide semiconductor layer is in contact with the first oxide semiconductor layer.

7. An insulated-gate field-effect transistor comprising:
a flat-plate-like electrode including a hole;
a first oxide semiconductor layer facing one surface of the electrode;
a second oxide semiconductor layer provided adjacent to a side surface of the hole in the electrode to be in contact with the first oxide semiconductor layer through the hole in the electrode; and
an insulating layer provided between the electrode and the first oxide semiconductor layer and between the electrode and the second oxide semiconductor layer,
wherein the first oxide semiconductor layer is thicker than the second oxide semiconductor layer.

8. The insulated-gate field-effect transistor according to claim 7,
wherein an insulator is provided to cover the second oxide semiconductor layer, and
wherein a second electrode is in contact with the second oxide semiconductor layer through an opening formed in the insulator.

9. The insulated-gate field-effect transistor according to claim 8, wherein the opening overlaps with the flat-plate-like electrode.

10. The insulated-gate field-effect transistor according to claim 7, wherein the first oxide semiconductor layer is formed on one selected from the group consisting of an insulating substrate, a p-type single crystal silicon substrate, an n-type single crystal silicon substrate, and a conductive substrate.

11. The insulated-gate field-effect transistor according to claim 7, wherein the electrode comprises one selected from the group consisting of a metal, a conductive oxide, and a conductive nitride.

12. The insulated-gate field-effect transistor according to claim 8, wherein the second electrode comprises one selected from the group consisting of a metal, a conductive oxide, and a conductive nitride.

13. The insulated-gate field-effect transistor according to claim 7, further comprising an electrode overlapping with a portion where the second oxide semiconductor layer is in contact with the first oxide semiconductor layer.

14. An insulated-gate field-effect transistor comprising:
a flat-plate-like first oxide semiconductor layer;
a first electrode provided on one surface of the first oxide semiconductor layer, the first electrode being insulated from the first oxide semiconductor layer;
a film-like second oxide semiconductor layer provided to cover a side surface of the first electrode, the second oxide semiconductor layer being insulated from the first electrode;
a second electrode in contact with the second oxide semiconductor layer; and
a third electrode in contact with the other surface of the first oxide semiconductor layer,
wherein the second oxide semiconductor layer is in contact with the first oxide semiconductor layer, and
wherein the first oxide semiconductor layer is thicker than the second oxide semiconductor layer.

15. The insulated-gate field-effect transistor according to claim 14,
wherein an insulator is provided to cover the second oxide semiconductor layer, and
wherein the second electrode is in contact with the second oxide semiconductor layer through an opening formed in the insulator.

16. The insulated-gate field-effect transistor according to claim 15, wherein the opening overlaps with the first electrode.

17. The insulated-gate field-effect transistor according to claim 14, wherein the first oxide semiconductor layer is formed on one selected from the group consisting of an insulating substrate, a p-type single crystal silicon substrate, an n-type single crystal silicon substrate, and a conductive substrate.

18. The insulated-gate field-effect transistor according to claim 14, wherein the first electrode comprises one selected from the group consisting of a metal, a conductive oxide, and a conductive nitride.

19. The insulated-gate field-effect transistor according to claim 14, wherein the second electrode comprises one selected from the group consisting of a metal, a conductive oxide, and a conductive nitride.

20. The insulated-gate field-effect transistor according to claim 14, further comprising an electrode overlapping with a portion where the second oxide semiconductor layer is in contact with the first oxide semiconductor layer.

\* \* \* \* \*